United States Patent [19]
Mizrahi

[11] Patent Number: 6,125,128
[45] Date of Patent: Sep. 26, 2000

[54] LASER OUTPUT LOCKING AND SELF FILTERING DEVICE

[75] Inventor: Victor Mizrahi, Columbia, Md.

[73] Assignee: Ciena Corporation, Linthicum, Md.

[21] Appl. No.: 08/969,268

[22] Filed: Nov. 13, 1997

[51] Int. Cl.[7] .............................. H04B 10/24; H01S 3/10; G02B 6/28
[52] U.S. Cl. ................................ 372/20; 359/114; 385/24
[58] Field of Search .............................. 372/20; 359/634, 359/114, 124; 385/24

[56] References Cited

U.S. PATENT DOCUMENTS

| | | | |
|---|---|---|---|
| 5,077,816 | 12/1991 | Glomb et al. | 385/37 |
| 5,212,711 | 5/1993 | Harvey et al. | 372/94 |
| 5,274,659 | 12/1993 | Harvey et al. | 372/94 |
| 5,283,686 | 2/1994 | Huber | 359/337 |
| 5,299,212 | 3/1994 | Koch et al. | 372/32 |
| 5,497,386 | 3/1996 | Fontana | 372/18 |
| 5,696,859 | 12/1997 | Onaka et al. | 385/24 |
| 6,005,995 | 12/1999 | Chen et al. | 385/24 |

FOREIGN PATENT DOCUMENTS 2-195305  8/1990  Japan .

OTHER PUBLICATIONS

McCadams et al., CLEO'97, Paper CThW6, pp. 447–448.
Woodward et al., *IEEE Photonics Technology Letters*, vol. 5, No. 6, Jun. 1993, pp. 628–630.
Lee et al., CLEO'95, Paper Ctu10, pp. 93–94.
Morton et al., OFC'96 Technical Digest, Paper TuH6, pp. 39–40.

*Primary Examiner*—Frank G. Font
*Assistant Examiner*—Armando Rodriguez
*Attorney, Agent, or Firm*—Daniel N. Daisak; David L. Soltz

[57] ABSTRACT

In accordance with the present invention, an optical device is provided which is used to lock the output of an optical transmitter as well as being employed as a self-filtering element within an optical system. An optical transfer element, coupled along the optical transmission path, either reflects or transmits a portion of the light signal associated with the desired channel wavelength. A portion of the optical signal is supplied to a circuit which controls the output of the transmitter.

7 Claims, 6 Drawing Sheets

LASER OUTPUT LOCKING AND SELF FILTERING DEVICE

FIELD OF INVENTION

The present invention generally relates to optical communication systems and more particularly to an apparatus for controlling the output of an optical transmitter.

BACKGROUND OF INVENTION

Wavelength division multiplexing (WDM) is a technique for increasing the capacity of existing fiber optic networks by transmitting a plurality of channels over a single waveguide medium. WDM systems typically include a plurality of transmitters for transmitting modulated information signals on a designated one of a plurality of optical channels or wavelengths. The channels are combined by a multiplexer at a first terminal and transmitted to a demultiplexer at a receiving terminal where the channels are separated. One or more amplifiers positioned along a transmission fiber amplify the transmitted signal. The separated channels are then supplied to receiving circuitry which converts the optical signals into electrical signals for processing.

The transmitters used in WDM systems typically include semiconductor lasers each transmitting on a designated one of a plurality of wavelengths typically within the 1550 nm range. The output signal of each semiconductor laser is controlled by an associated drive current such that the transmitter output is locked to a particular channel wavelength and modulated with communication information either directly or externally. Since the transmitted wavelengths are relatively close to each other, the laser transmitters must be precisely controlled in order to insure integrity of the communication information. Channel spacings in a WDM system are typically within the 100 GHz range. With the employment of more advanced wavelength separation devices, 50 GHz and even 25 GHz spacings may also be employed. Because these channel spacings are so close together, if the laser transmitter should lose lock during operation, the output signal of one channel may interfere with an adjacent channel, thereby corrupting the transmitted communication signal.

When a laser transmitter used in a WDM system is first turned on, it experiences a ramp-up period where the drive current must first increase to a level where the semiconductor laser provides light at the desired wavelength and at peak power. During this ramp-up period, the laser transmitter is not yet operating at the desired wavelength, however light still propagates down the transmission fiber. In addition, during laser transmitter operation, the laser output may drift off-channel allowing unwanted light to propagate down the fiber. This unwanted light transmission may impact adjacent channel transmission and/or may compromise the integrity of the transmitted information signals.

Thus, there is a need to provide an optical device which locks the wavelength output of a laser transmitter in an optical transmission system as well as being configured as a self filtering device for preventing unwanted light signals to propagate down a transmission fiber.

SUMMARY OF INVENTION

The present invention meets these needs and avoids the above-referenced drawbacks by providing an optical device for supplying signals for controlling the output of an optical transmitter and providing a self filtering means for preventing unwanted light signals from propagating down a transmission fiber. The optical device in accordance with the present invention includes a first transmission path for carrying a light signal from a source of light. A filtering element is coupled to the first transmission path and receives light from the source of light. The filtering element has a transmissivity and reflectivity characteristic as a function of wavelength where the filtering element is configured to transmit a first portion of light associated with a particular wavelength and reflects a second portion of light which is outside of the particular wavelength. A first optical splitter is coupled to the filtering element and receives the first portion of the light. A second optical splitter coupled along the transmission path receives the second portion of the light. A first photodetector is coupled to the first optical splitter and receives a percentage of the first portion of the light and generates a first sense signal in response thereto. A second photodetector is coupled to the second optical splitter and receives the second portion of the light and generates a second sense signal in response thereto. A control circuit receives the first and second sense signals and generates a control signal, based on the sense signals, for controlling the light outputted from the source of light.

The foregoing, and other features and advantages of the present invention, will be apparent from the following description, the accompanying drawings and the appended claims.

DETAILED DESCRIPTION

In accordance with the present invention, an optical apparatus is used to lock the wavelength output of a laser transmitter as well as providing a self filtering configuration for preventing the transmission of an optical signal outside the desired channel wavelength from propagating down an output fiber. An optical transfer element coupled along a transmission path of an optical communication system receives an optical signal having a particular wavelength from a light source or transmitter. The transfer element includes at least one filtering element which either reflects or transmits, depending upon the configuration, the signal having the desired channel wavelength to an optical path. If the signal is not within the desired wavelength, the signal is prevented from propagating down the optical path. A portion of the signal is supplied to circuitry which controls the output of the transmitter.

Figure 1:
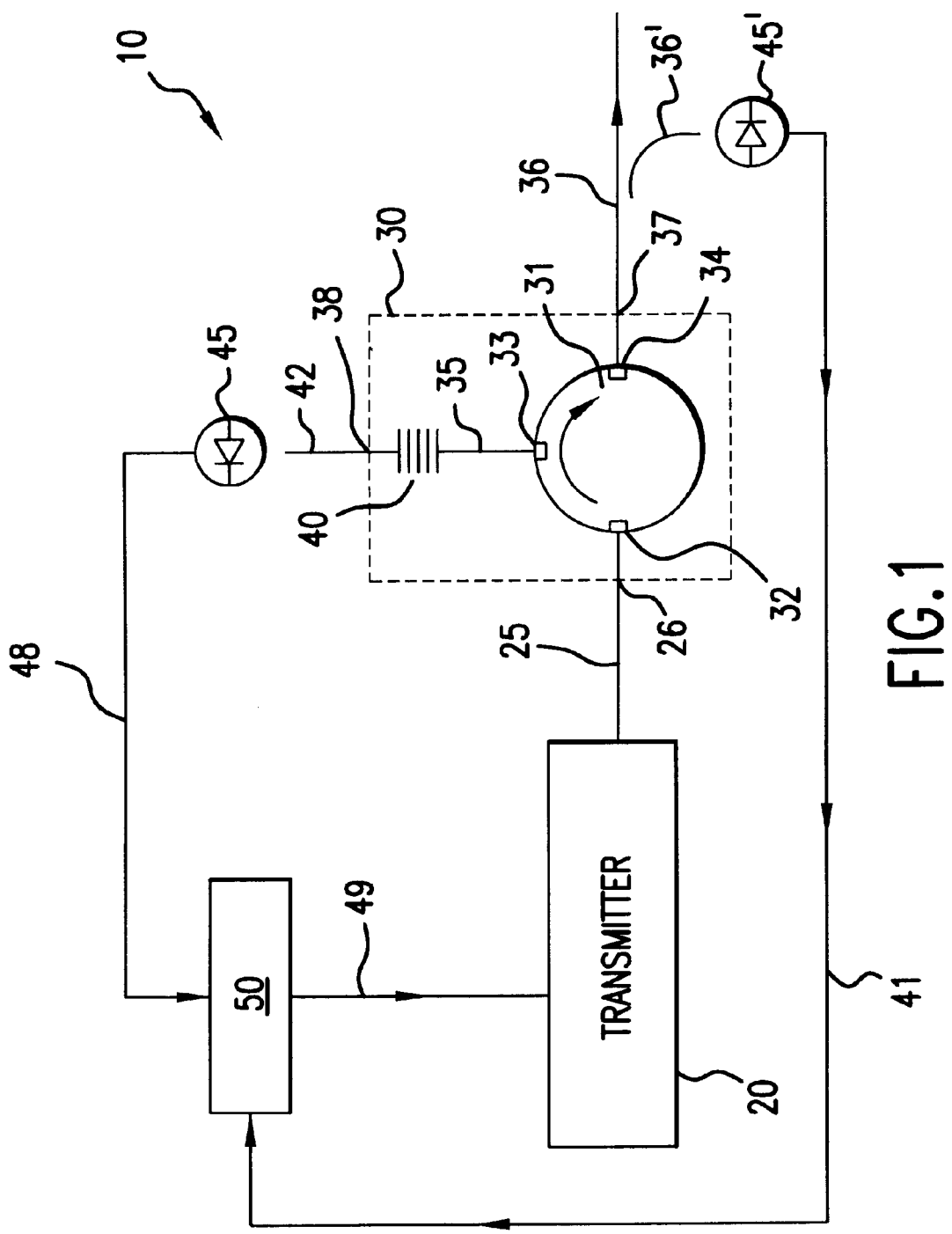
FIG. 1 is a schematic illustration of a fail safe laser locking apparatus in accordance with the present invention.

FIG. 1 schematically illustrates an optical device 10 in accordance with the present invention wherein transmitter 20, such as a semiconductor laser, is coupled to the input 26 of optical transfer element 30 via transmission path 25. Amplifiers can be coupled along path 25 to increase the signal power and transmission distance of the output of transmitter 20. Optical transfer element 30 includes circulator 31 and filtering element 40. Circulator 31 has first, second and third ports 32, 33 and 34, respectively and is configured such that optical signals which enter port 32 exit through port 33 and optical signals which enter port 33 exit through port 34.

The first circulator port 32 receives the optical signal produced by transmitter 20 and carried via optical path 25. Circulator 31 and transmitter 20 can be located within a particular node or module within a communications network. The signal enters circulator 31 at port 32 and rotates, in a clockwise direction toward port 33. The signal exits circulator port 33 and is received by a filtering element 40 tuned to reflect one or more particular wavelengths. The filtering element 40 can be, for example, a Bragg-grating which is coupled to port 33 by way of optical path 35.

Figure 2:
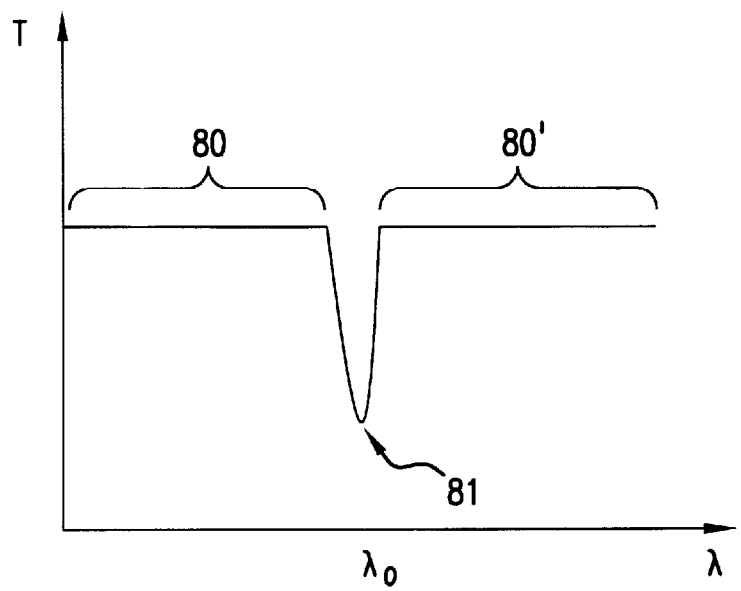
FIG. 2 illustrates a graph of transmittance and wavelength of an exemplary filtering element utilized in an optical device in accordance with the present invention.

The transmittance vs. wavelength spectrum of an exemplary filtering element 40 is shown in FIG. 2. Filtering element 40 is tuned to have a low transmissivity and high reflection characteristic at wavelength $\lambda_O$ and a high transmissivity or pass-through characteristic at wavelengths other than $\lambda_O$. Accordingly, a first portion of the light signal received from transmitter 20, for example having wavelength $\lambda_O$, is reflected by filtering element 40 back to circulator port 33. The reflected portion of the signal travels clockwise in circulator 31 toward circulator port 34 and exits transfer element 30 at output 37 onto optical path 36. A second portion of the signal, denoted in FIG. 2 as portions 80 and 80', is transmitted through filtering element 40 to a monitoring point at photodetector 45 via optical path 42 from transfer element output 38.

Photodetector 45 receives the second portion of the signal which is outside the reflectivity bandwidth of filtering element 40 and generates electrical sense signals in response thereto. These signals are supplied to control circuitry 50 via line 48. Control circuitry 50 is coupled to transmitter 20 via optical path 49. Circuitry 50 controls the output of transmitter 20. For example, where transmitter 20 is a semiconductor laser, circuitry 50 generates output signals which control the drive current supplied to the laser in transmitter 20, thereby adjusting the output of the laser to remain within operating bandwidth 81 shown in FIG. 2. Control circuitry 50 can include hardware and/or software configurations. Examples of these types of control circuitry are included in Application Ser. No. 08/848,423 entitled "Laser Wavelength Control Device" assigned to the assignee of the present invention and an application entitled "Laser Wavelength Control Under Direct Modulation" filed on Jul. 22, 1997 (Unofficial Ser. No. 08/898,714) also assigned to the assignee of the present invention, both of which are incorporated herein by reference.

Alternatively, an additional monitoring point can also be included within optical device 10 at photodetector 45'. A portion of the signal outputted onto line 36 may be tapped via line 36' and supplied to photodetector 45' where an electrical sense signal is generated in response thereto. The sense signal is supplied to control circuitry 50 via line 41, and used to control the output of transmitter 20 as described above.

If a portion of the output wavelength of transmitter 20 is not within wavelength $\lambda_O$, i.e. the signal drifts off-channel, that portion of the signal is transmitted through filtering element 40 rather than being reflected back through port 33. Likewise, when transmitter 20 is first turned on, it experiences a ramp-up period where a portion of the output wavelength has not reached the desired wavelength, e.g. $\lambda_O$. This unwanted signal portion is prevented from propagating down optical path 36 by way of filtering element 40 reflecting wavelength $\lambda_O$ back towards port 33 of circulator 31 and out port 34. In this manner, optical device 10 provides a transmitter locking device as well as a self-filtering configuration which prevents off-channel wavelengths from propagating down transmission path 36.

Figure 3:
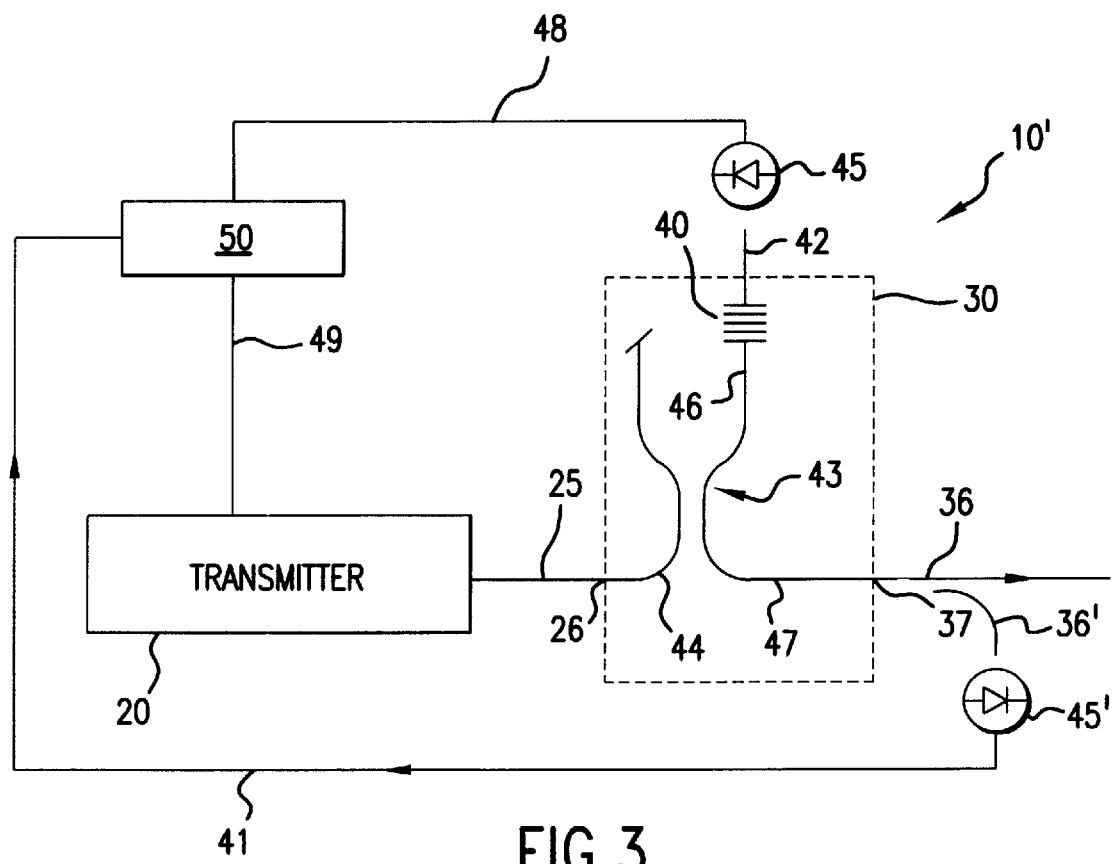
FIG. 3 is a schematic view of an alternative embodiment of an optical device in accordance with the present invention.

FIG. 3 is a schematic illustration of an alternative embodiment of optical device 10' in accordance with the present invention where transmitter 20 is coupled to the input 26 of optical transfer element 30 via a transmission path 25. Optical transfer element 30 includes an optical coupler 43, for example a fused fiber coupler, having an input path 44 for receiving the light signal from transmitter 20. Coupler 43 taps a percentage of the input signal from transmitter 20 and directs the signal onto input/output path 46. Filtering element 40 is coupled to input/output path 46 of coupler 43 and receives the signal tapped onto path 46 of coupler 43. Filtering element 40 can be, for example, a Bragg-grating configured to have a low transmissivity and high reflection characteristic at wavelength $\lambda_O$, and a high transmissivity or pass-through characteristic at wavelengths other than $\lambda_O$ similar to the filter spectrum shown in FIG. 2. A first portion of the light signal having wavelength $\lambda_O$ is reflected by filtering element 40 and directed toward path 47 of coupler 43 via input/output path 46. In this manner, the signal having wavelength $\lambda_O$ exits transfer element 30 at output 37 via coupler path 47.

The remaining portion of the signal received on input/output path 46 which is outside of wavelength $\lambda_O$ is transmitted through filtering element 40 to a monitoring point at photodetector 45 via line 42. Photodetector 45 receives this second portion of the signal which is outside the reflectivity bandwidth of filtering element 40 and generates an electrical sense signal in response thereto. This sense signal is supplied to control circuitry 50 via line 48. Control circuitry 50 is coupled to transmitter 20 via optical path 49 and controls the output of transmitter 20 as described above. Alternatively, an additional monitoring point can also be included within optical device 10' at photodetector 45'. A portion of the signal outputted onto line 36 may be tapped via line 36' and supplied to photodetector 45' where an electrical sense signal is generated in response thereto. The sense signal is supplied to control circuitry 50 via line 41 and used to control the output of transmitter 20 as described above.

Figure 4:
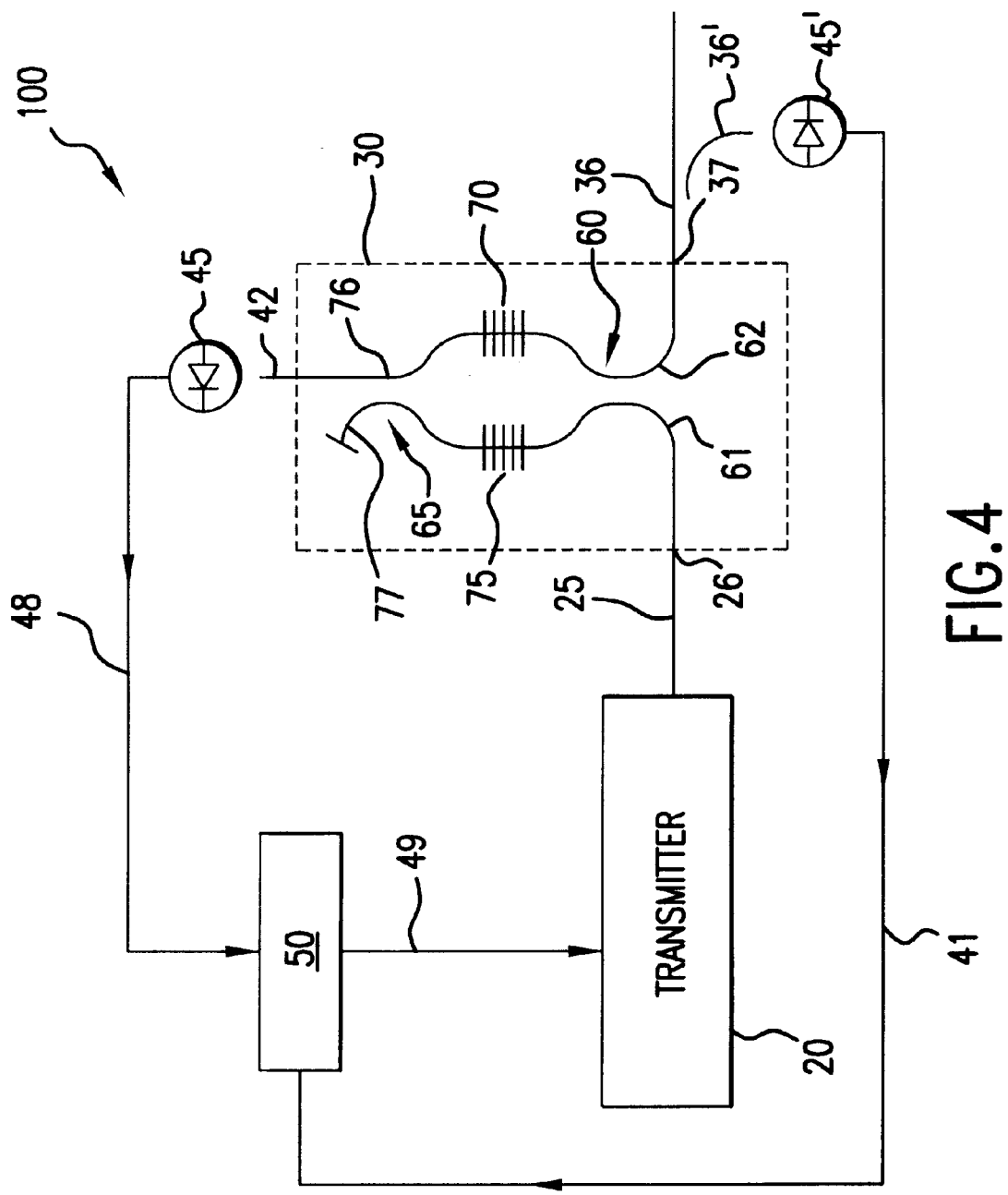
FIG. 4 is a schematic view of an alternative embodiment of an optical device in accordance with the present invention.

Referring to FIG. 4 which is a schematic illustration of an alternative embodiment of optical device 100 in accordance with the present invention, where transmitter 20 is coupled to the input 26 of optical transfer element 30 via a first transmission path 25. Optical transfer element 30 includes a first and second optical couplers 60 and 65 with narrow band filtering elements 70 and 75 disposed therebetween. Each of the couplers 60 and 65 can be, for example, fused fiber couplers. The light signal from transmitter 20 is received by coupler 60 on line 61. For purposes of illustration, couplers 60 and 65 tap 50% of the input signal from transmitter 20 in essence splitting the received signal, however tapping percentages can vary. A first portion of the signal received on line 61 is transferred, with a 90° phase-shift, to line 62 and is carried to filtering element 70. The other portion of the received signal from transmitter 20 continues on line 61 to filtering element 75.

Filtering elements 70 and 75 can be, for example, Bragg-gratings configured to have a low transmissivity and high reflection characteristic at wavelength $\lambda_O$, and a high transmissivity or pass-through characteristic at wavelengths other than $\lambda_O$ similar to the filter spectrum shown in FIG. 2. A first portion of the light signal having wavelength $\lambda_O$ is reflected by filtering element 75 and transferred to line 62 with a 90° phase-shift. Likewise, a second portion of the signal having wavelength $\lambda_O$ is reflected by filtering element 70 and carried on output line 62. Thus, the signal having wavelength $\lambda_O$ exits transfer element 30 at output 37 via line 62.

The remaining portions of the signal received from transmitter 20 outside of wavelength $\lambda_O$, are transmitted through filtering element 70 and 75 to a monitoring point at photodetector 45 via line 42. For example, a third portion of the signal, not reflected by filtering element 70 is first phase-shifted 90° when it jumps from line 61 to 62. This same signal receives another 90° phase shift when it jumps from line 76 to 77. Thus, the total phase shift for this third portion of the signal is 180° as compared with a fourth portion of the signal transmitted through filtering element 75 on line 61 which has a 0° phase shift thereby canceling-out both the third and fourth signal portions. However, a fifth portion of the signal which jumps from line 61 to 62, transmitted through filtering element 70 and carried on line 76 only incurs a 90° phase shift and is received by photodetector 45. Likewise, a sixth portion of the signal carried on line 61 and transmitted through filtering element 75, jumps to line 76, thereby incurring a 90° phase shift. This fifth portion of the signal as well as the sixth portion of the received signal from transmitter 20 are in phase and received at photodetector 45.

Photodetector 45 receives these signals which are outside the reflectivity bandwidth of filtering elements 70 and 75 and generates an electrical signal in response thereto. This sense signal is supplied to control circuit 50 via line 48. Control circuit 50 is coupled to transmitter 20 via optical path 49. As described above, circuit 50 controls transmitter 20 locking the transmitter output at wavelength $\lambda_O$. Alternatively, an additional monitoring point can also be included within optical device 100 at photodetector 45'. A portion of the signal outputted onto line 36 may be tapped via line 36' and supplied to photodetector 45' where an electrical sense signal is generated in response thereto. The sense signal is supplied to control circuitry 50 via line 41, and used to control the output of transmitter 20 as described above.

If a portion of the output wavelength of transmitter 20 is not within wavelength $\lambda_O$, i.e. the signal drifts off-channel, that portion of the signal is transmitted through filtering elements 70 and 75 rather than being reflected back through transfer element output 37 via line 62. Likewise, when transmitter 20 outputs a signal whose wavelength is not the selected channel, for example $\lambda_O$, the signal is prevented from propagating down optical path 36 by way of filtering elements 70 and 75 only reflecting wavelength $\lambda_O$ back towards port transfer element output 37. In this manner, optical device 100 provides a transmitter locking device as well as a self-filtering means which prevents off-channel wavelengths from propagating down transmission path 36.

Figure 5:
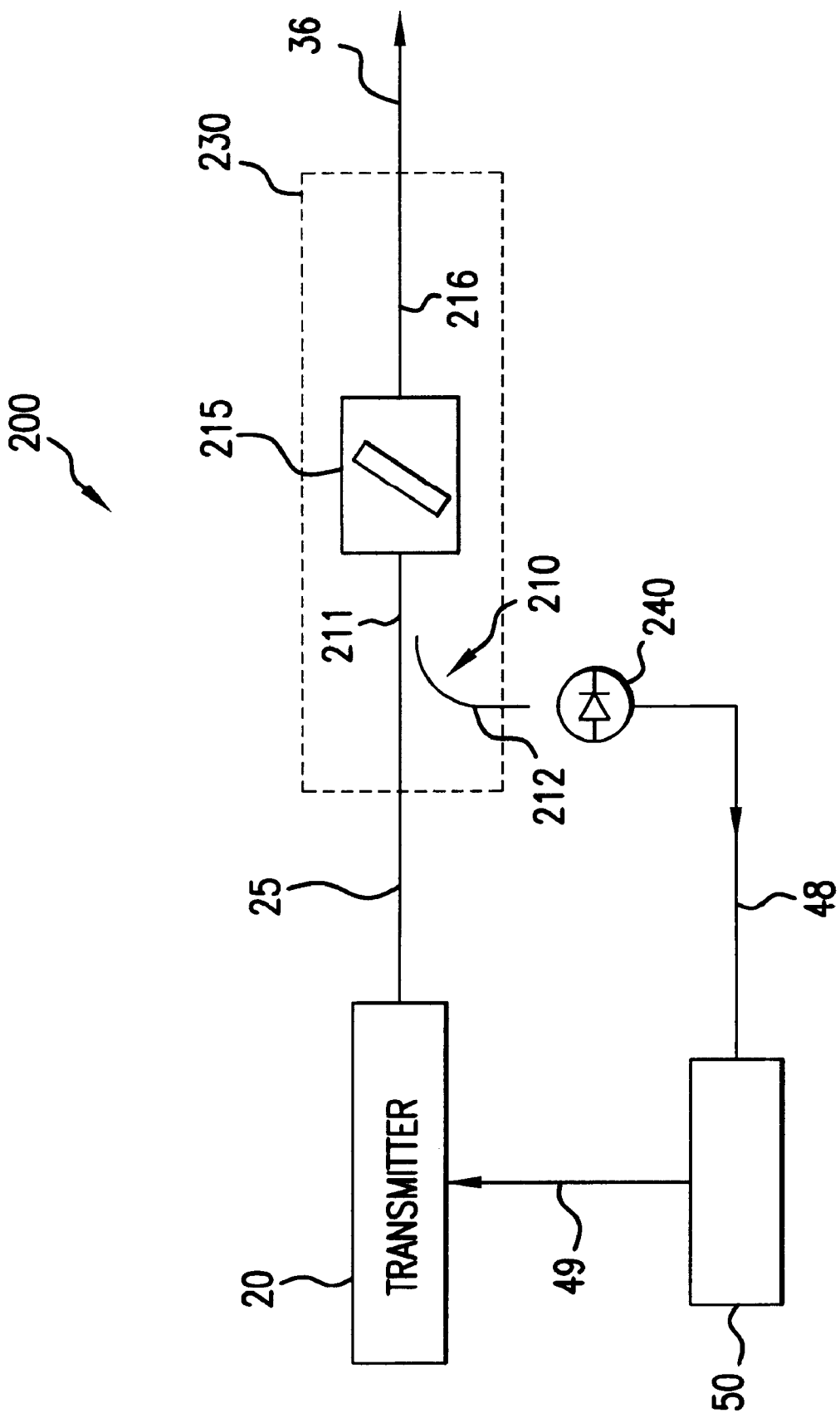
FIG. 5 is a schematic view of an alternative embodiment of an optical device in accordance with the present invention.

Referring to FIG. 5 which is a schematic illustration of an alternative embodiment of optical device 200 in accordance with the present invention, where transmitter 20 is coupled to optical transfer element 230 via a first transmission path 25. Optical transfer element 230 includes a splitter 210 coupled to a filtering element 215. The light signal from transmitter 20 passes first optical splitter 210 and is received by filtering element 215 via line 211.

Filtering element 215 is configured to have a high transmissivity characteristic at particular wavelengths, $\lambda_O \ldots \lambda_N$ and low transmissivity and reflection characteristic at wavelengths other than $\lambda_O \ldots \lambda_N$ as described in more detail below. Filtering element 215 can be, for example a high finesse Fabry-Perot filter. The light signal received from splitter 210 via line 211 having a particular wavelength, for example $\lambda_O$, is transmitted through filtering element 215 to line 216 and propagates down optical path 36. Filtering element 215 reflects the remaining portion of the light signal received from transmitter 20 which is outside wavelength $\lambda_O$ and supplies it to splitter 210 where it is directed to output line 212. Photodetector 240 receives this portion of the signal from splitter 210 and generates an electrical sense signal in response thereto. Control circuit 50 is coupled to photodetector 240 by way of line 48 and to transmitter 20 by way of line 49. Control circuit 50 receives the sense signal and generates a control signal, based on the received sense signal, for controlling the signal output of transmitter 20. As described above, circuit 50 is used to lock the output of transmitter 20 to a particular wavelength.

Figure 6:
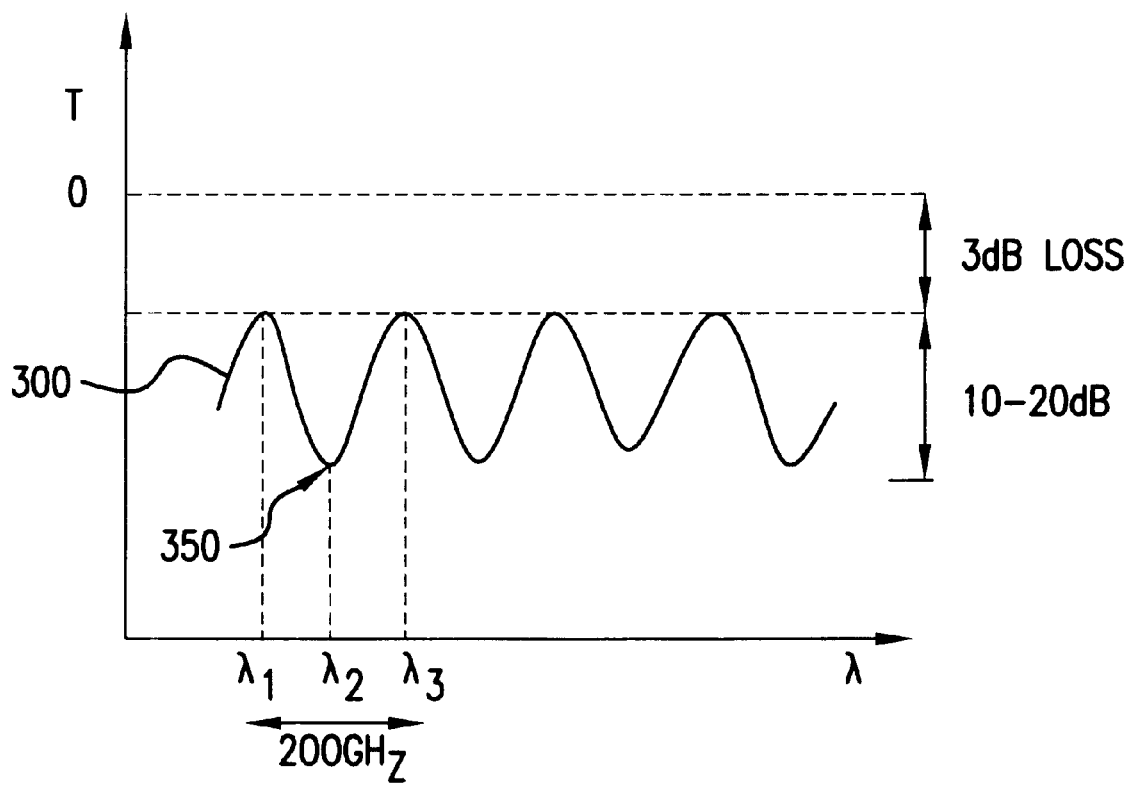
FIG. 6 illustrates a graph of transmittance and wavelength of an exemplary filtering element utilized in an optical device in accordance with the present invention.

Filtering element 215 is configured to have a high transmissivity at particular wavelengths and low transmissivity at other wavelengths. FIG. 6 illustrates a transmission spectrum 300 for odd numbered channels in a WDM systems using a Fabry-Perot filter of the type referred to with reference to FIG. 5. This type of filter, manufactured by Dicon Corp., has 100 GHz free spectral range with 3 dB minimum loss and 10–20 dB restriction. The Fabry-Perot filter employed as filtering element 215 has 200 GHz free spectral range for a 100 GHz channel spaced WDM system. Thus, a WDM system using this type of Fabry-Perot filter can employ one filtering element for the odd numbered channels $\lambda_1, \lambda_3$, etc. and one for the even numbered channels $\lambda_2, \lambda_4$, etc. In this manner, the risk of having transmitter 20 lock to the wrong channel is reduced because the adjacent channel is at a minimum as indicated by spectrum portion 350. For example, transmitter 20, such as a semiconductor laser, using the optical device in accordance with the present invention locks onto an optical channel having wavelength $\lambda_1$. By using a filtering element for the odd channels and another for the even channels, the risk of transmitter 20 locking onto a channel having wavelength $\lambda_3$ is significantly reduced because the adjacent channel having wavelength $\lambda_2$ is at a minimum (spectrum portion 350) and the control circuitry used to lock transmitter 20 is configured to detect such a significant channel deviation. Thus, if transmitter 20 drifts off-channel or outputs a signal not within the selected wavelength for that particular channel, optical device 200 acts as a laser locking apparatus as well as a self filtering means and prevents the unwanted signals from propagating down optical path 36.

Figure 7:
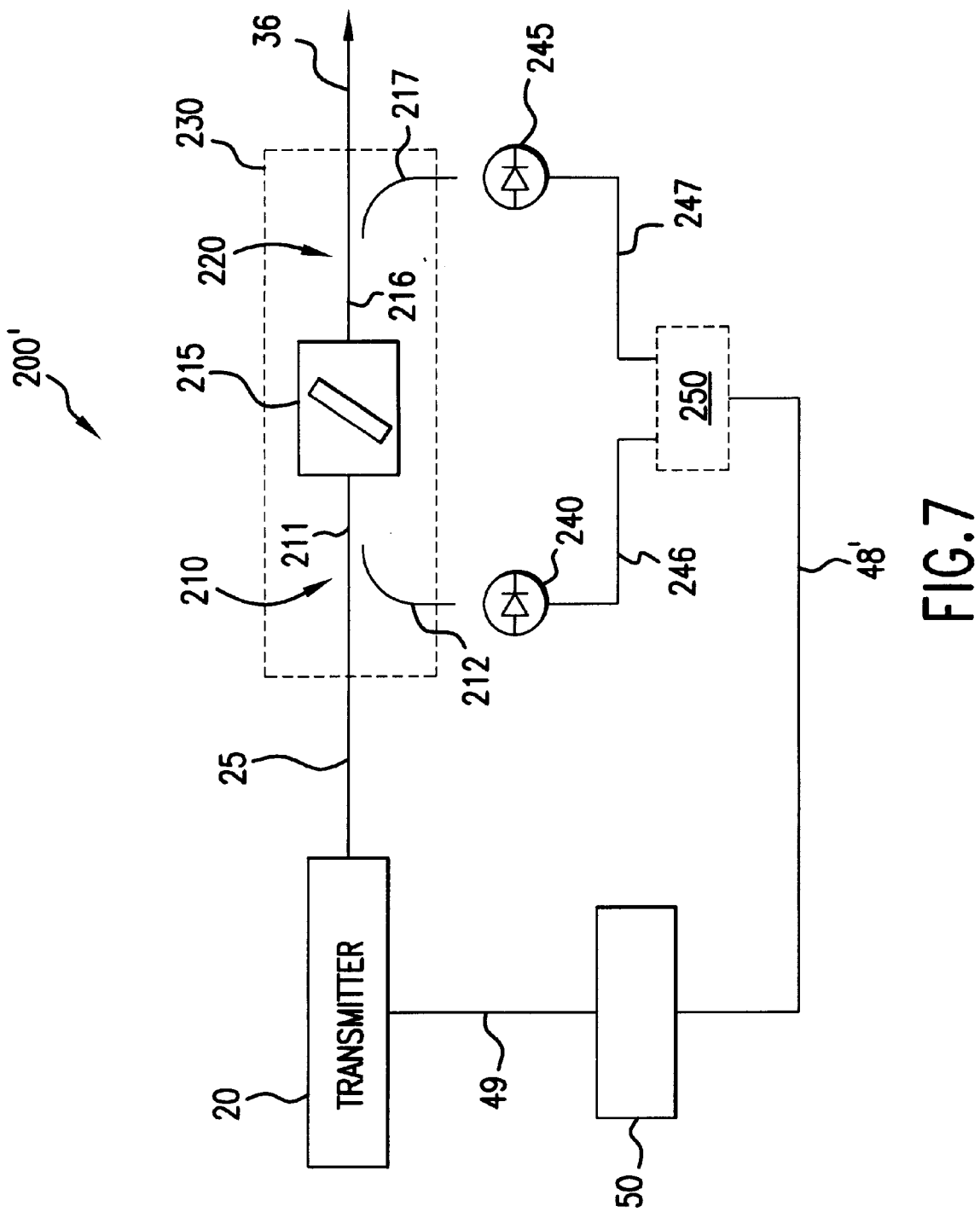
FIG. 7 is a schematic view of an alternative embodiment of an optical device in accordance with the present invention.

Referring to FIG. 7 which is a schematic illustration of an alternative embodiment of optical device 200' in accordance with the present invention, where transmitter 20 is coupled to optical transfer element 230 via a first transmission path 25. Optical transfer element 230 includes a first optical splitter 210, a second optical splitter 220 and a filtering element 215 disposed between first splitter 210 and second splitter 220. The light signal from transmitter 20 passes first optical splitter 210 and is received by filtering element 215 via line 211.

As described with reference to FIG. 5, filtering element 215 can be, for example a high finesse Fabry-Perot filter configured to have a high transmissivity characteristic at particular wavelengths, $\lambda_O \ldots \lambda_N$ and low transmissivity or reflection characteristic at wavelengths other than $\lambda_O \ldots \lambda_N$. The light signal received from splitter 210 via line 211 having a particular wavelength (e.g. $\lambda_O$)is transmitted through filtering element 215 to splitter 220 via line 216. Splitter 220 outputs a portion of the light signal having the particular wavelength received from filtering element 215 for propagation down optical path 36. Splitter 220 also outputs a relatively small portion of the light signal having the particular wavelength to line 217 which is coupled to photodetector 245 and which generates an electrical signal in response thereto. Filtering element 215 reflects the remaining portion of the light signal received from transmitter 20 which is outside the particular wavelength (e.g. $\lambda_O$) and supplies it to splitter 210 where it is directed to output line 212. Photodetector 240 receives this portion of the signal from splitter 210 and generates an electrical signal in response thereto.

Interface circuitry 250 receives the electrical signals from photodetectors 240 and 245 from lines 246 and 247, respectively and supplies them to control circuitry 50 via line 48. Alternatively, control circuit 50 can be configured to receive the electrical signals directly from photodetectors 240 and 245, thereby eliminating interface circuitry 250. As described above, circuit 50 is used to lock the output of transmitter 20 to a particular wavelength.

While the foregoing invention has been described in terms of the embodiments discussed above, numerous variations are possible. Accordingly, modifications and changes such as those suggested above, but not limited thereto, are considered to be within the scope of the following claims.

What is claimed is:

1. An optical device comprising:
   a source of light;
   a first transmission path coupled to said source of light;
   a filtering element coupled to said first transmission path for receiving said light, said filtering element having a transmissivity and reflectivity characteristic as a function of wavelength, said filtering element configured to transmit a first portion of said light associated with a particular wavelength and to reflect a second portion of said light which is outside of said particular wavelength;
   a second transmission path coupled to said filtering element, said second transmission path receiving said first portion of said light;
   an optical splitter coupled to said filtering element along said first transmission path, said splitter receiving said second portion of said light;
   a photodetector coupled to said optical splitter, said photodetector receiving said second portion of said light and generating a sense signal in response thereto;
   a control circuit receiving said sense signal, said control circuit generating a control signal, based on said sense signal, for controlling said light outputted from said light source.

2. The optical device in accordance with claim 1, wherein said optical splitter is a first optical splitter, said optical device further comprising a second optical splitter coupled to said filtering element along said second transmission path and receiving at least a part of said first portion of said light signal.

3. The optical device in accordance with claim 2, wherein said photodetector is a first photodetector and said sense signal is a first sense signal, said optical device further comprising a second photodetector receiving said at least a part of said first portion of said light from said second splitter and generating a second sense signal in response thereto.

4. The optical device in accordance with claim 3 wherein said control is configured to receive said first sense signal and said second sense signal, said control circuit generating a control signal, based on said first and second sense signals, for controlling said light outputted from said light source.

5. The optical device in accordance with claim 1 wherein said filtering element comprises a Fabry-Perot filter.

6. The optical device in accordance with claim 3 further comprising interface circuitry for receiving said first and second sense signals and supplying said sense signals to said control circuitry.

7. The optical device in accordance with claim 2, wherein said first optical splitter, said second optical splitter and said filtering element are configured, within a particular module, with said source of light.

* * * * *